United States Patent [19]
Mydill et al.

[11] Patent Number: 5,265,101
[45] Date of Patent: Nov. 23, 1993

[54] FUNCTION ARRAY SEQUENCING FOR VLSI TEST SYSTEM

[75] Inventors: Marc R. Mydill; Mark E. Carlson, both of Garland, Tex.

[73] Assignee: Texas Instruments Incorporated, Dallas, Tex.

[21] Appl. No.: 338,360

[22] Filed: Apr. 12, 1989

Related U.S. Application Data

[63] Continuation of Ser. No. 97,231, Sep. 14, 1987, abandoned.

[51] Int. Cl.[5] ........................................... G01R 31/28
[52] U.S. Cl. ..................................................... 371/27
[58] Field of Search ...................... 324/73 R, 73 AT; 371/15, 16, 20, 25, 27

[56] References Cited

U.S. PATENT DOCUMENTS

| | | | |
|---|---|---|---|
| 4,500,993 | 2/1985 | Jacobson | 371/16 |
| 4,517,661 | 5/1985 | Graf et al. | 364/900 |
| 4,604,744 | 8/1986 | Littlebury et al. | 371/27 X |
| 4,639,919 | 1/1987 | Chang et al. | 371/27 |
| 4,646,299 | 2/1987 | Schinabeck et al. | 371/20 |
| 4,807,161 | 2/1989 | Comfort et al. | 364/550 |

FOREIGN PATENT DOCUMENTS 204130 11/1986 European Pat. Off. .......... 324/73 R

OTHER PUBLICATIONS

Electronics, Eugene, "Microprogramming helps check LSI RAMs and logic", Dec. 4, 1980, vol. 53, No. 26, pp. 137–141.
Electronics, Gillette, "Tester takes on VLSI with 264-K vectors behind its pins", Nov. 3, 1981, vol. 54, No. 22, pp. 122–127.
Electronics, Hansen, "Functional and in-circuit testing team up to tackle VLSI in the '80s", Apr. 2, 1981, pp. 189–195.
Electronic Production, Finnell, "In-Circuit Testing of LSI-based PCBs", Sep. 1982, pp. 47–53.

Primary Examiner—Stephen M. Baker
Attorney, Agent, or Firm—W. James Brady, III; B. Peter Barndt; Richard L. Donaldson

[57] ABSTRACT

A function array system includes a controller, a test function and specific memories to accelerate the execution of a VLSI device test program by preloading register files associate with each hardware function in the tester with test set-up information. Test information is transferred to the register files only once when the test program is initially downloaded into the tester. A simple controller sequences a test set-up pointer during test execution.

5 Claims, 7 Drawing Sheets

Fig. 1

PRIOR ART

FUNCTION ARRAY SEQUENCING FOR VLSI TEST SYSTEM

This application is a continuation, of application Ser. No. 07/097,231, filed Sep. 14, 1987, now abandoned.

BACKGROUND OF THE INVENTION

This invention relates to semiconductor devices and more particularly to a system for testing VLSI devices.

PRIOR ART

Prior art testers usually include a processor that loads programming registers with hardware programing for each device to be tested. Each time a device is to be tested, the programing registers for each device under test has to be reprogrammed. The reprogramming requires time and decreases the speed by which devices are tested.

During the execution of a typical VLSI test program, the device under test is actually exercised (tested) only 10 percent to 50 percent of the testing time. The remaining time of 90 percent to 50 percent of the test time represents test program execution overhead (time to load test program into programing registers) associated with the tester. The majority of the overhead corresponds to the time required to program the test system hardware functions associated with the various test condition setups typically required to test a VLSI device.

It is common throughout the course of a test to vary parameters such as supply power voltage, signal switching reference levels, and operating frequency as well as to perform a variety of types of DC parametric tests. Each test condition variation and each parametric test type may require a significant amount of reprogramming of tester hardware.

The amount of tester hardware required to test a device is basically proportional to the pin count of the device. Therefore, the typically high pin count of VLSI devices results in a significant amount of tester hardware to be programmed, compounding the problem of test program execution overhead.

SUMMARY OF THE INVENTION

In conventional testers, the hardware functions are programmed via registers that are loaded by a hardware controller. These registers are generally addressed as if they were memory locations in the controller's address space. Every hardware function in the tester is assigned a unique address corresponding to its programming register. In order to initialize the tester for a particular test setup, every hardware register involved in the test must be written to. Because of the limited data transfer bandwidth associated with the hardware controller and data bus, the transfer of test setup information to the hardware registers represents a "bottleneck" in the execution of the test program.

The present invention replaces the tester's hardware programming registers with random access memories which serve as register files. The memory is loaded, when the test program is initially called, with information corresponding to all test setups required by the test program. In other words, rather than storing the test program information in the hardware controller's bulk memory and transferring the information to hardware registers via the "bottleneck" during the test program execution, the information is initially loaded into the hardware memories via the "bottleneck" once when the test program is called. As the test program executes, the hardware controller only needs to "point" to the specific test program addresses, thereby programming all hardware functions simultaneously. The present invention represents a technical advance over prior art testers in that in the prior art testers, the programming information must travel through the "bottleneck" every time the program is cycled as well as every time the hardware configuration is changed within the program.

The hardware controller must be able to select each hardware programming memory individually in order to initially load setup information. This allows control of individual functions if variables are used to program particularly setup changes. The controller is also able to address the memories collectively to achieve simultaneous programming of groups of functions. The actual implementation of the hardware programming memories can be modified to enable the use of quad digital to analog converter devices.

The setup address bus may be divided into function groups in order to expand the flexibility of the test system. For example, the pin electronics (the functional and AC test interface to the device under test), DC test subsystem, and relay matrix (defining the signal paths between the functions and pins under test) may be separated and controlled by three setup address registers. This enables the system to change one group of tester functions without affecting the other groups, thereby conserving setups or function sets. If a particular test setup involves a change to only one pin electronics, it is not necessary to consume an additional setup location in the DC subsystem or relay matrix.

The present invention greatly simplifies testing procedures from prior art testers, reduces test program execution time providing higher tester throughput. The technical advance represented by the invention as well as other objects and advantages will be apparent from the following description of an example of the invention, when considered in conjunction with the accompanying drawings, and the novel features set forth in the claims.

DESCRIPTION OF A PREFERRED EMBODIMENT

Figure 1:
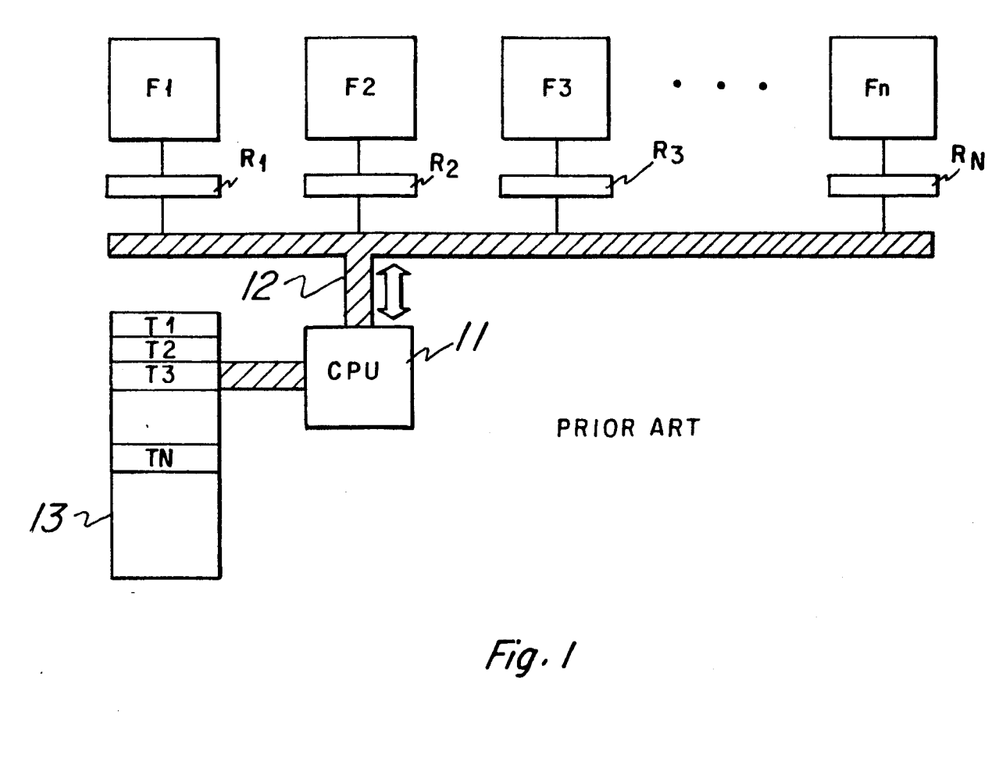
FIG. 1 is a functional block diagram of a prior art tester.

FIG. 1 is a functional block diagram of a prior art tester. The tester includes a CPU 11, a program memory 13, and a data/address bus 12 connecting the CPU 11 to a number of programming registers R1 through Rn. Each programming register R1 . . . Rn is connected to its respective hardware function generator F1 through Fn.

The test setups to be used are in the program memory 13. As each test is performed, the CPU 11 programs each program register R1 through Rn through the data-/address bus 12. Since each program register R1 though Rn has to be programmed separately each time a particular test is to be conducted, considerable time is consumed in programming each hardware function generator to perform a test that may typically last for only a few micro seconds. This limits the number of devices that may be tested in a given time.

Figure 2:
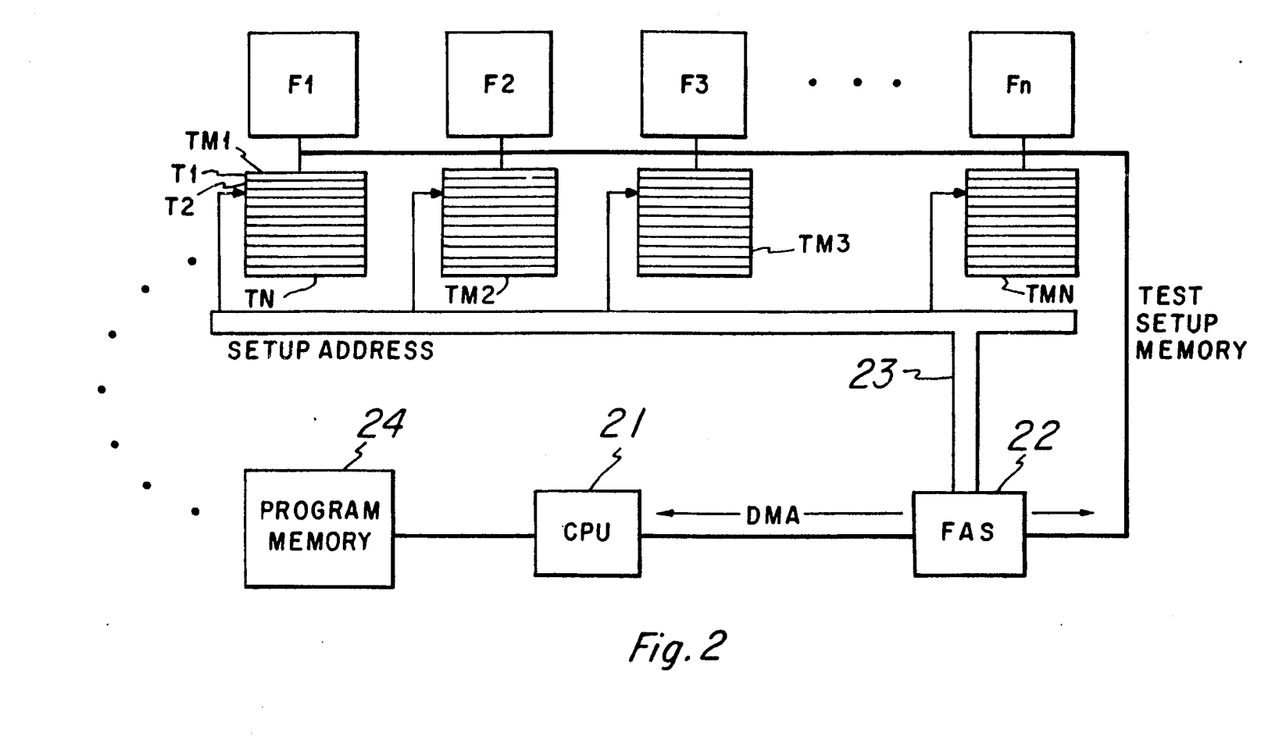
FIG. 2 is a block diagram illustrating one embodiment of the present invention.

FIG. 2 illustrates a preferred embodiment of the present invention. The basic system includes a CPU 21, a program memory 24, a function array sequencing controller (FAS) 22 which is a "smart" DMA (Direct Memory Access) controller, a plurality of test setup memories T1 through Tn, and a plurality of hardware function generators F1 through Fn. The functions of the FAS controller may be performed by the CPU in some embodiments depending on the performance characteristics of the CPU.

Before the first execution of the test, or when the test program is initially loaded, CPU 21 loads the test programs which are stored in the program memory 24 (or stored in a network to which the test system is connected) into the test setup memory registers TM1 through TMn. Each test memory TMn includes a plurality of locations T1 though Tn, each location storing a function value associated with a different test program or procedure.

After each test memory location has been loaded with its corresponding function value, it is then a simple operation for the hardware controller (or CPU) 22 to address the appropriate test memory location TMn to program its associated hardware function generator Fn. This procedure is illustrated in FIG. 3.

Figure 3:
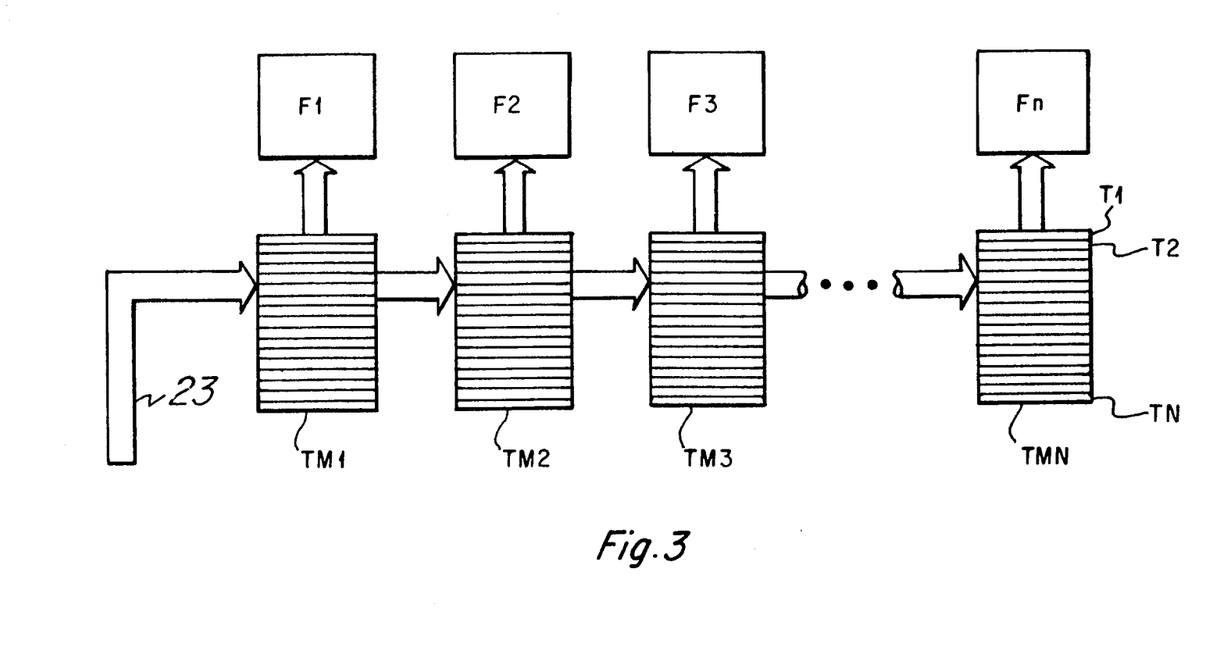
FIG. 3 illustrates hardware setup addressing.

FIG. 3 illustrates the plurality of test setup memories, the hardware function generators Fn and the address bus line 23. When the system is initially programed, the function values associated with each test program or procedure are loaded into a corresponding location T1 through Tn in the test setup memories Tm1 through TMn. The program indexes to each register and loads the associated function values for all test procedures. Once this is accomplished, the system is programmed for all tests to be made on each device under test, each test being implemented rapidly and in sequence without out the need to interrupt the test to load in the next test or procedure.

Figure 4:
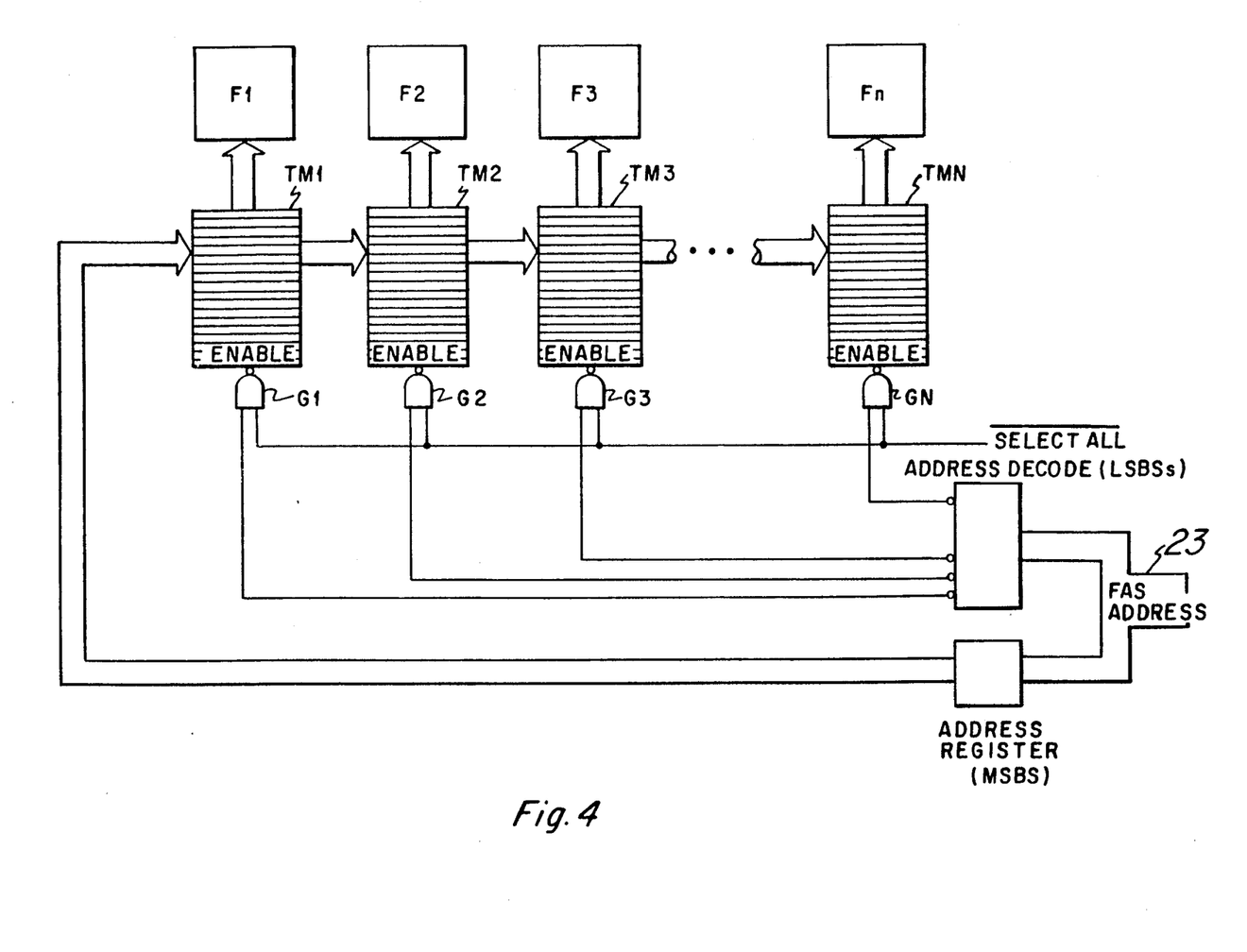
FIG. 4 illustrates is a diagram of hardware addressing.

A possible implementation of sequencing through the test procedures and enabling each test setup register is illustrated in FIG. 4. The FAS controller must be able to address the memory locations T1through Tn in each test memory TMn collectively to achieve simultaneous programming of groups of functions. This is accomplished by the FAS controller sending via bus 23 the FAS address for each test setup data to be used for a particular test. An address register points to the register Tn in each test memory TMn which contains the program/procedure to be used for the next test.

The address of the register is contained in the most significant bits in the data word sent by the FAS controller. An address decode register accepts the least significant bits of the data word, and in conjunction with a select all line is nanded to enable the appropriately addressed register Tn to program its corresponding hardware function generator. Addressing of individual memories is possible to change variables and/or programming of individual hardware function generators.

Figure 5:
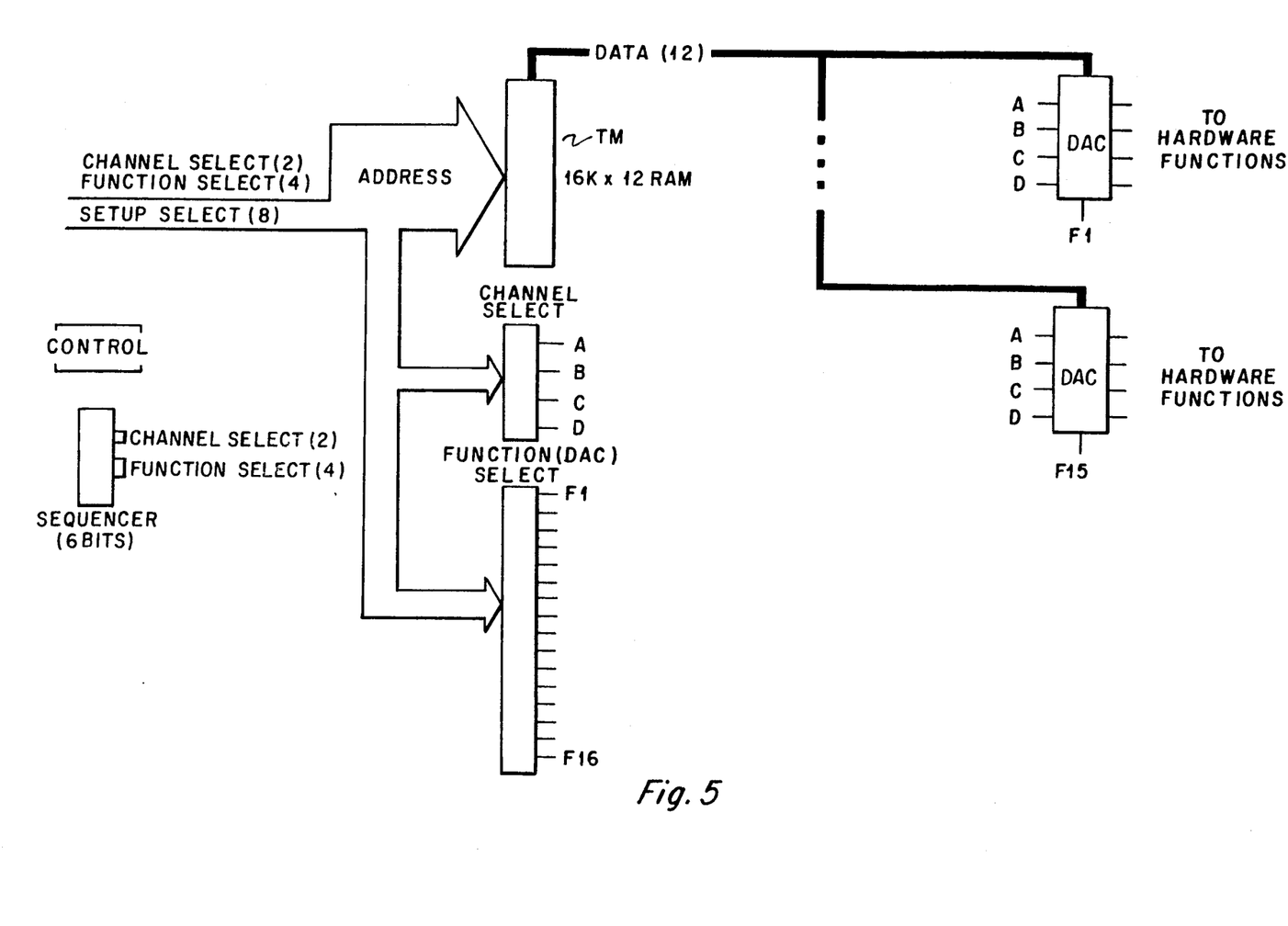
FIG. 5 illustrates using quad digital-to-analog converters for hardware control.

Since many of the tester hardware function generators Fn are programmed using digital-to-analog converters (DACs), it is convenient and cost effective to use quad DAC packages. An implementation using quad DACs is illustrated in FIG. 5. Each DAC supplies a particular function to four pins of the device under test.

FIG. 5 illustrates the use of Quad DAC's to convert digitally encoded information to analog signals used in the hardware function generators. The FAS address bus is used to determine which program/procedure setup is to be used. The channel and function selection is then quickly sequenced to simultaneously program large groups of functions. The register TM may be, for example, a 16k by 12 random access memory (RAM). Therefore, three 64K RAMS may be used for all 256 setups and the 16 functions/setups for four pins of a device under test.

The RAM is addressed to determine which program/procedure is to be selected and directed to the DAC's. The channel select selects one of four channels (A-D) corresponding to four pins of the device under test. As illustrated, the Function Select may select up to one out of 16 DAC's. By using the select circuits illustrated in FIG. 5, each appropriate hardware function may be easily programmed.

Figure 6:
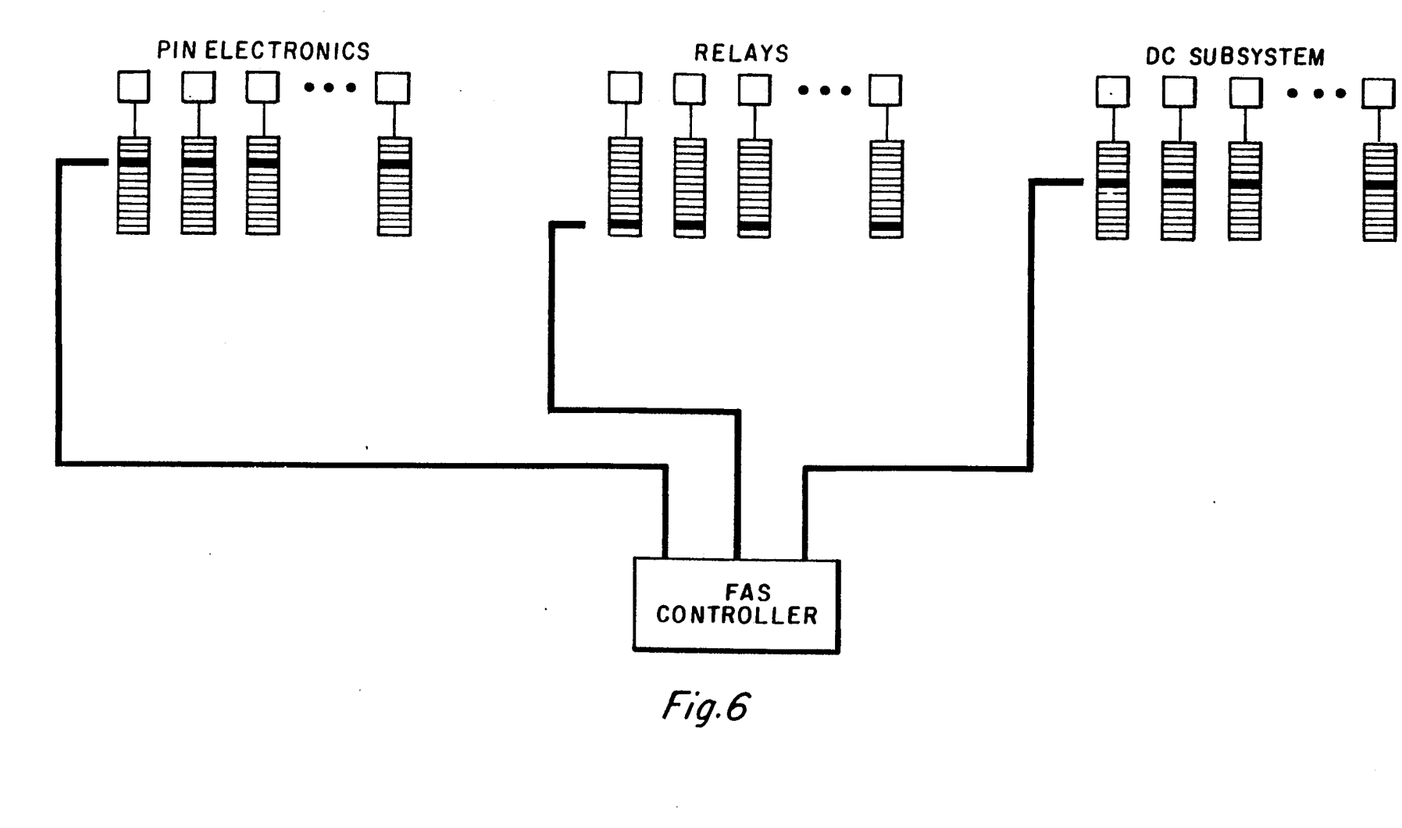
FIG. 6 illustrates test function separation through the use of three setup address registers.

FIG. 6 illustrates that function groups may be divided in order to expand the flexibility of the system. The address bus is divided so that one branch of the bus addresses pin electronics, the functional and AC interface to the device under test.

A second branch of the address bus interfaces with the relay matrix which defines the signal paths between the tester and the device under test, and the third branch interfaces with the DC test subsystem. By using the separate branches, the FAS system can change one group of tester functions without affecting the other groups, thereby conserving setups or function sets. For example, if a particular test setup involves a change to only the pin electronics, it would not be necessary to consume an additional setup location in the DC subsystem or relay matrix.

Figure 7:
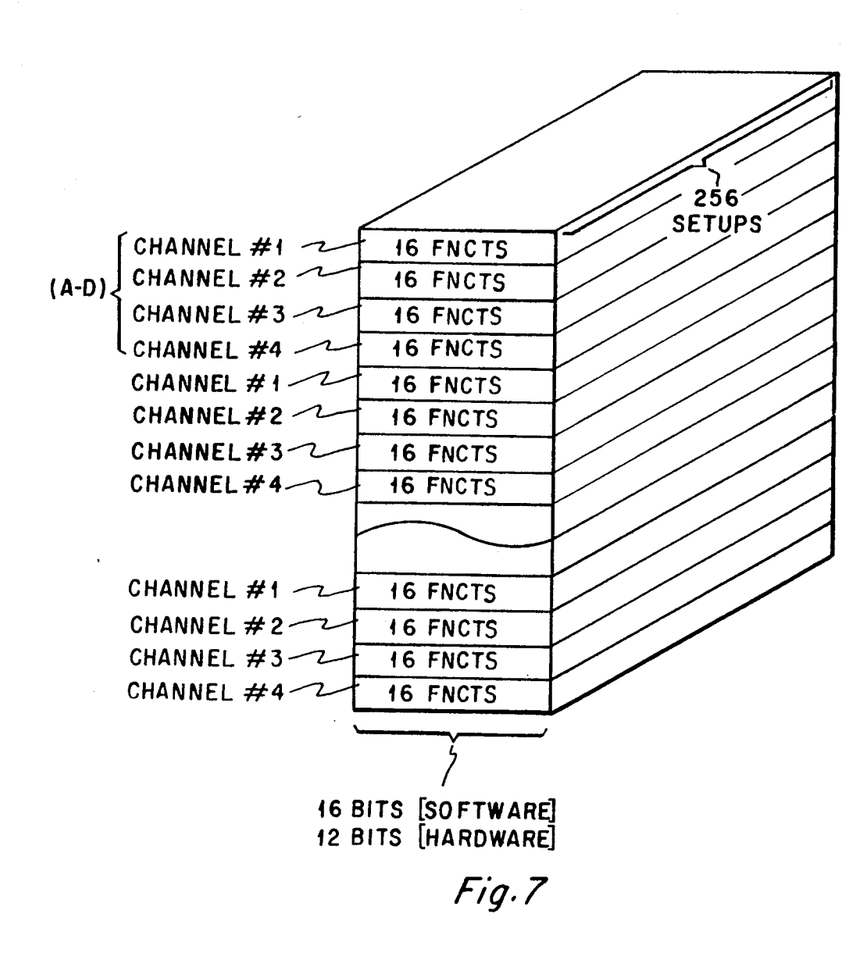
FIG. 7 illustrates memory organization.

FIG. 7 illustrates a memory Tm of FIG. 6 in more detail. It may be seen that each memory Tm is capable, as configured, to include up to 256 setups or 16 functions per pin. Each channel is connected to one input (A-D) of each DAC. The sixteen functions control a DAC as illustrated as the Function (DAC) select F1 through F16.

What is claimed is:

1. A test system for testing integrated circuits with a plurality of tests, comprising:
   a central controller for selecting a test to be performed from among said plurality of tests;
   a plurality of function generators operating in parallel to carry out the selected test;
   pin electronics for applying test parameters to the integrated circuits under test;
   a set up address bus divided into function groups, wherein one of said function groups may be changed without affecting the other function groups;
   and setup registers for controlling which of said function groups may be changed.

2. The test system according to claim 1, wherein the pine electronics are the functional and AC test interface to the integrated circuit under test.

3. The test system according to claim 1, including test setup memory registers, each test setup memory register including a plurality of register locations, each location storing a function value associated with a different test procedure, the function value being used to program one of said plurality of function generators associated with each one of said test setup memory registers.

4. The test system according to claim 1, wherein the function groups include pin electronics, a DC test subsystem and a relay matrix.

5. The test system according to claim 4, including a setup address register for each function group allowing the changing of tester function of one function group without changing others.

* * * * *